(12) United States Patent
Tamura

(10) Patent No.: US 8,292,079 B2
(45) Date of Patent: Oct. 23, 2012

(54) SEMICONDUCTOR CHIP HOLDING TRAY

(75) Inventor: Ryohei Tamura, Chino (JP)

(73) Assignee: Seiko Epson Corporation, Tokyo (JP)

(*) Notice: Subject to any disclaimer, the term of this patent is extended or adjusted under 35 U.S.C. 154(b) by 144 days.

(21) Appl. No.: 12/843,268

(22) Filed: Jul. 26, 2010

(65) Prior Publication Data

US 2011/0056862 A1 Mar. 10, 2011

(30) Foreign Application Priority Data

Sep. 9, 2009 (JP) ................. 2009-208520

(51) Int. Cl.
B65D 21/00 (2006.01)
B65D 85/00 (2006.01)
B65D 85/48 (2006.01)
B65D 1/34 (2006.01)

(52) U.S. Cl. ........ 206/509; 206/503; 206/710; 206/454; 206/564

(58) Field of Classification Search .................. 361/809; 206/503, 328, 330, 331, 725, 722, 712, 716, 206/701, 564, 726, 511, 509, 710, 454; 172/52.1, 172/52

See application file for complete search history.

(56) References Cited

U.S. PATENT DOCUMENTS

| 5,481,438 A * | 1/1996 | Nemoto ................ 361/810 |
| 5,492,223 A * | 2/1996 | Boardman et al. ....... 206/710 |
| 2007/0068882 A1* | 3/2007 | Yoshizawa ............ 211/41.18 |
| 2009/0050519 A1* | 2/2009 | Tamura et al. ........... 206/712 |

FOREIGN PATENT DOCUMENTS

| JP | A-10-050815 | 2/1998 |
| JP | A-2007-109763 | 4/2007 |
| JP | A-2007-109764 | 4/2007 |
| JP | A-2009-49169 | 3/2009 |

* cited by examiner

Primary Examiner — J. Gregory Pickett
Assistant Examiner — James M Van Buskirk
(74) Attorney, Agent, or Firm — Oliff & Berridge, PLC

(57) ABSTRACT

A semiconductor chip holding tray, includes: a base substrate; a first projection provided on the front surface of the base substrate, and disposed on a short edge side of the perimeter of a holding area, has a depression; a first raised portion provided on the front surface, and is disposed on a long edge side of the perimeter; a triangular cross-section second projection provided on the rear surface of the base substrate, and is disposed on a short edge side of the perimeter of a holding area; and a second raised portion provided on the rear surface, and is disposed on a long edge side of the perimeter of the holding area. The tray is arranged such that when two trays are stacked the second projection is fitted in the depression of the first projection.

7 Claims, 10 Drawing Sheets

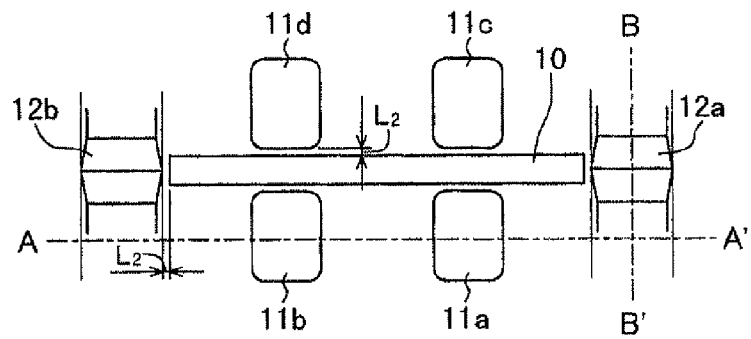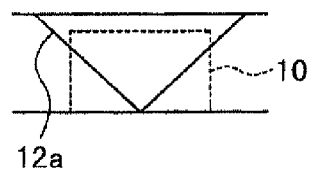
FIG. 1A
FIG. 1C
FIG. 1B
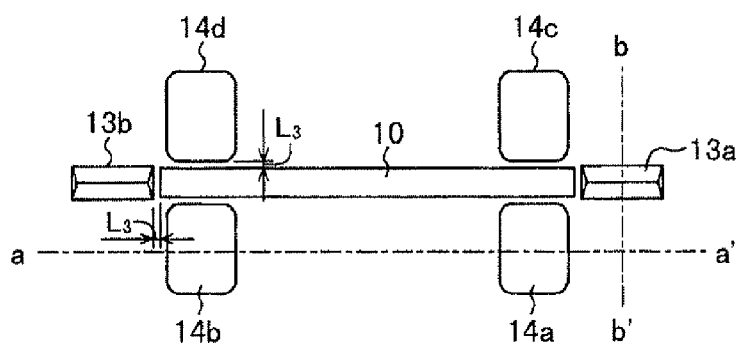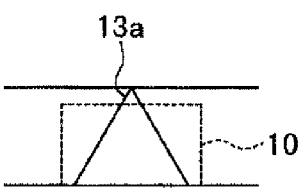
FIG. 2A
FIG. 2C
FIG. 2B

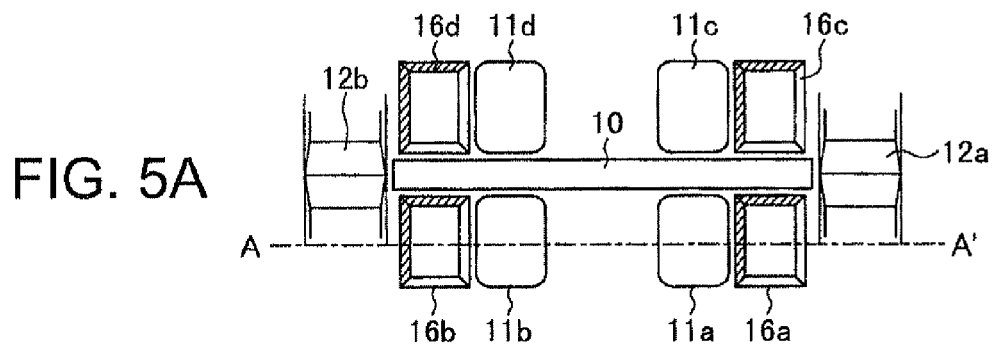
FIG. 5A
FIG. 5B
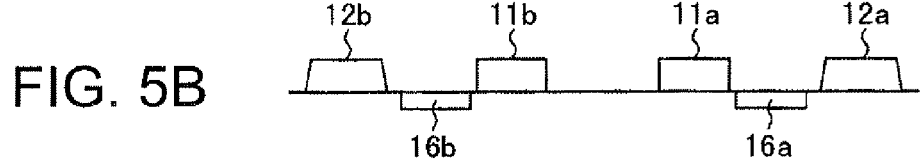
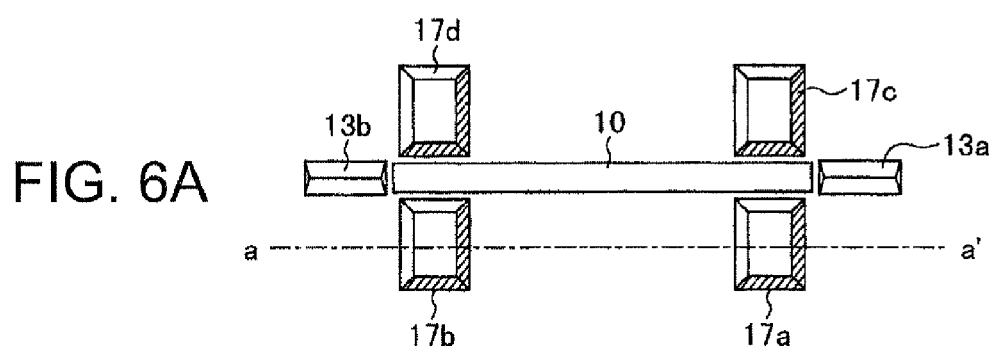
FIG. 6A
FIG. 6B
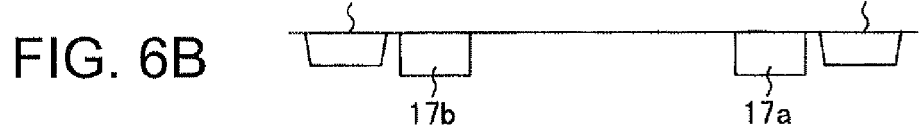
FIG. 7
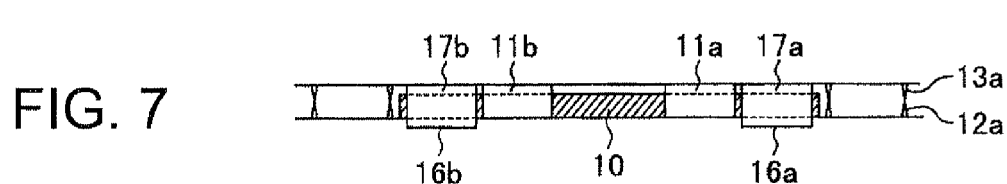

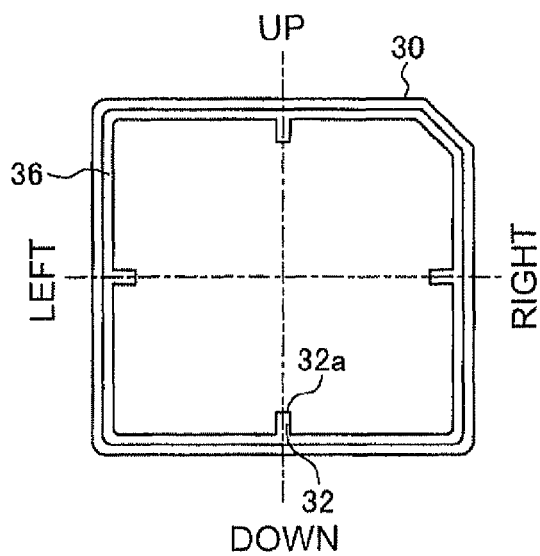
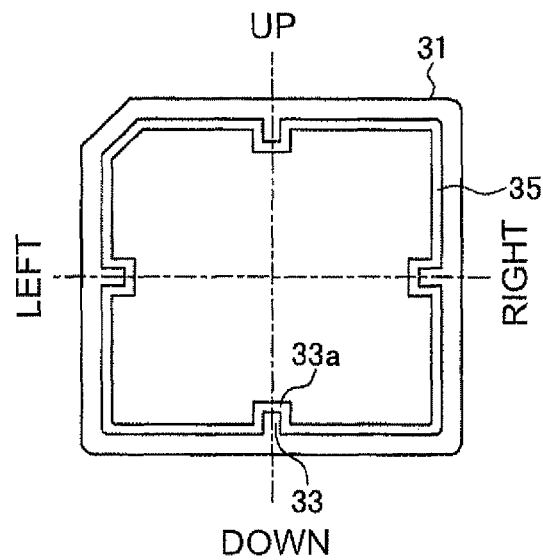
FIG. 9A    FIG. 9B
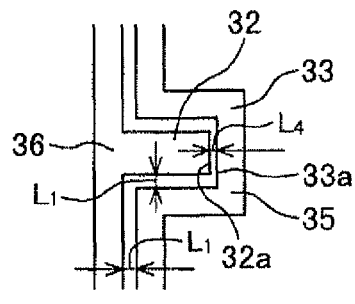
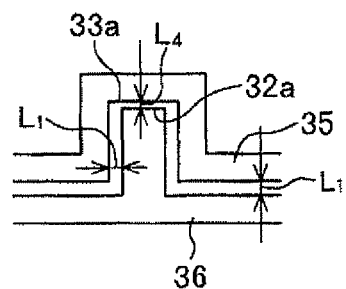
FIG. 10A    FIG. 10B

SEMICONDUCTOR CHIP HOLDING TRAY

The entire disclosure of Japanese Patent Application No. 2009-208520, filed Sep. 9, 2009 is expressly incorporated by reference herein.

BACKGROUND

1. Technical Field

The present invention relates to a semiconductor chip holding tray, and to a semiconductor chip holding tray with which it is possible to realize a faceup holding and facedown holding of even a semiconductor chip made thinner and formed in a narrower strip.

2. Related Art

As one of semiconductor chip mounting methods, there is a COG (Chip On Glass) method, and this mounting method is a method of mounting a semiconductor chip with a bump directly on a substrate. A semiconductor chip on which a bump is formed, for the purpose of preventing the bump from being damaged, is held on a semiconductor chip holding tray in a condition in which an active surface on which the bump is formed is faced upward (faceup) when the semiconductor chip is conveyed. As opposed to this, for the COG mounting, it is necessary to place the semiconductor chip in a condition in which the active surface thereof is faced downward (facedown) when the semiconductor chip is mounted. For this reason, it is necessary to turn the semiconductor chip holding tray upside down when taking the semiconductor chip out from the semiconductor chip holding tray.

A heretofore known semiconductor chip holding tray includes projections for holding a semiconductor chip on the front surface and rear surface of the tray. For this reason, it is possible to prevent the bump of the semiconductor chip from being damaged even in the event that the semiconductor chip is put into a facedown condition by inverting the semiconductor chip holding tray after a tray on which a semiconductor chip is held faceup has been stacked thereon. Consequently, it is possible to freely handle a faceup holding and facedown holding without doing damage to the semiconductor chip (for example, refer to JP-A-2009-49169).

However, with the heretofore known semiconductor chip holding tray, due to the semiconductor chip being made thinner and formed into a narrower strip, it may happen that a holding condition becomes unstable when inverting the semiconductor chip holding tray from a faceup holding condition to a facedown holding condition.

SUMMARY

An advantage of some aspects of the invention is to provide a semiconductor chip holding tray with which it is possible to realize a stable faceup holding and facedown holding of even a semiconductor chip made thinner and formed in a narrower strip.

According to one aspect of the invention, there is provided a semiconductor chip holding tray, a plurality of which are used by being stacked one on another, which holds a plurality of semiconductor chips of a rectangular planar shape, including a base substrate; a first projection which, being provided on the front surface of the base substrate, and disposed on a short edge side of the perimeter of a holding area in which one semiconductor chip is held, has a depression in which a triangular cross-section projection is fitted; a first raised portion which, being provided on the front surface of the base substrate, is disposed on a long edge side of the perimeter of the holding area; a second projection which, being provided on the rear surface of the base substrate, is disposed on a short edge side of the perimeter of a holding area in which one semiconductor chip is held; and a second raised portion which, being provided on the rear surface of the base substrate, is disposed on a long edge side of the perimeter of the holding area. When two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, the second projection is fitted in the depression of the first projection, and the first raised portion and second raised portion are not aligned.

According to the semiconductor chip holding tray, when two semiconductor chip holding trays are stacked one on the other in such a way that the front surface of the base substrate is opposed to the rear surface of the base substrate, the second projections are fitted in the depressions of the first projections. By so doing, it is possible to stably stack one semiconductor chip holding tray on another.

According to another aspect of the invention, there is provided a semiconductor chip holding tray, a plurality of which are used by being stacked one on another, which holds a plurality of semiconductor chips of a rectangular planar shape, including a base substrate; a first projection which, being provided on the front surface of the base substrate, and disposed on a short edge side of the perimeter of a holding area in which one semiconductor chip is held, has a depression in which a triangular cross-section projection is fitted; a depressed portion which, being provided on the front surface of the base substrate, is disposed on a long edge side of the perimeter of the holding area; a triangular cross-section second projection which, being provided on the rear surface of the base substrate, is disposed on a short edge side of the perimeter of a holding area in which one semiconductor chip is held; and a raised portion which, being provided on the rear surface of the base substrate, is disposed on a long edge side of the perimeter of the holding area. When two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, and the second projection is fitted in the depression of the first projection.

Also, with the semiconductor chip holding tray according to the aspect of the invention, it is preferable that the side wall of the raised portion is formed in a two-step tapered form, and the upper portion of the side wall of the raised portion is formed in a more gently angled tapered form than the lower portion.

Also, with the semiconductor chip holding tray according to the aspect of the invention, it is preferable that it includes a first ring-like raised portion which, being formed on the front surface of the base substrate, is formed along the outer perimeter of the base substrate; and a second ring-like raised portion which, being formed on the rear surface of the base substrate, is formed along the outer perimeter of the base substrate, wherein the first ring-like raised portion has a projecting boss whose projection leading end is directed toward the center side of the front surface of the base substrate, the second ring-like raised portion has a depressed boss whose depression base end is directed toward the center side of the rear surface of the base substrate, and when two semiconductor chip holding trays are stacked one on the other in such a way that the front surface of the base substrate is opposed to the rear surface of the base substrate, the first ring-like raised portion and second ring-like raised portion have a space L1 therebetween, and the projection leading end and depression base end have therebetween a space L4 smaller than the space L1.

Also, with the semiconductor chip holding tray according to the aspect of the invention, it is preferable that it includes a first ring-like raised portion formed on the front surface of the base substrate; and a second ring-like raised portion formed on the rear surface of the base substrate, wherein the first ring-like raised portion has a projecting boss whose projection leading end is directed upward perpendicular to the front surface of the base substrate, the second ring-like raised portion has a depressed boss whose depression base end is directed downward perpendicular to the rear surface of the base substrate, the side wall of each of the projecting boss and depressed boss is formed in a tapered form, and when two semiconductor chip holding trays are stacked one on the other in such a way that the front surface of the base substrate is opposed to the rear surface of the base substrate, a base substrate rear surface side space L4 between the side wall of the projecting boss and the side wall of the depressed boss is formed smaller than a base substrate front surface side space L1 between the side wall of the projecting boss and the side wall of the depressed boss.

According to still another aspect of the invention, there is provided a semiconductor chip holding tray, a plurality of which are used by being stacked one on another, which holds a plurality of semiconductor chips of a rectangular planar shape, including a base substrate; a first projection which, being provided on the front surface of the base substrate, and disposed on a short edge side of the perimeter of a holding area in which one semiconductor chip is held, has a depression in which a triangular cross-section projection is fitted; a second projection which, being provided on the front surface of the base substrate, and disposed on a long edge side of the perimeter of the holding area, has a depression in which a triangular cross-section projection is fitted; a triangular cross-section third projection which, being provided on the rear surface of the base substrate, is disposed on a short edge side of the perimeter of a holding area in which one semiconductor chip is held; and a triangular cross-section fourth projection which, being provided on the rear surface of the base substrate, is disposed on a long edge side of the perimeter of the holding area. When two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, and the third and fourth projections are fitted in the depressions of the corresponding first and second projections.

Also, with the semiconductor chip holding tray according to the aspect of the invention, it is preferable that it further includes a pedestal provided in the holding area on the front surface of the base substrate.

BRIEF DESCRIPTION OF THE DRAWINGS

The invention will be described with reference to the accompanying drawings, wherein like numbers reference like elements.

FIG. 1A is a plan view showing a condition in which one semiconductor chip is held on the front surface of a first semiconductor chip holding tray according to a first embodiment. FIG. 1B is a sectional view of the A-A' portion shown in FIG. 1A, and FIG. 1C is a sectional view of the B-B' portion shown in FIG. 1A.

FIG. 2A is a plan view showing a condition in which one semiconductor chip is held on the rear surface of a second semiconductor chip holding tray according to the first embodiment. FIG. 2B is a sectional view of the a-a' portion shown in FIG. 2A. FIG. 2C is a sectional view of the b-b' portion shown in FIG. 2A.

FIG. 5A is a plan view showing a condition in which one semiconductor chip is held on the front surface of a first semiconductor chip holding tray according to a second embodiment. FIG. 5B is a sectional view of the A-A' portion shown in FIG. 5A.

FIG. 6A is a plan view showing a condition in which one semiconductor chip is held on the rear surface of a second semiconductor chip holding tray according to the second embodiment. FIG. 6B is a sectional view of the a-a' portion shown in FIG. 6A.

FIG. 7 is a sectional view showing a condition in which the front surface of the first semiconductor chip holding tray and the rear surface of the second semiconductor chip holding tray are opposed to each other.

FIG. 9A is a plan view showing the whole of the front surface of a first semiconductor chip holding tray according to a third embodiment. FIG. 9B is a plan view showing the whole of the rear surface of a second semiconductor chip holding tray.

FIGS. 10A and 10B are enlarged plan views in a condition in which the second semiconductor chip holding tray shown in FIG. 9B is stacked on the first semiconductor chip holding tray shown in FIG. 9A.

DESCRIPTION OF EXEMPLARY EMBODIMENTS

Hereafter, a detailed description will be given of embodiments of the invention with reference to the drawings. However, the invention not being limited to the following description, it could be easily understood by those skilled in the art that the form and details of the invention can be variously changed without departing from the spirit and scope thereof. Consequently, the invention shall not be interpreted by being limited to the description of the embodiments, to be given hereafter.

First Embodiment

A semiconductor chip holding tray according to a first embodiment is a tray for holding and conveying a plurality of semiconductor chips of a rectangular planar shape, and when conveying the semiconductor chips, a plurality of the trays, after being stacked one on another, are tied into a bundle with a tray band. Hereafter, the front surface of the semiconductor chip holding tray is defined as a surface faced upward during the conveyance, and the up-down relationship of the semiconductor chip holding tray is determined with a case in which the front surface of the semiconductor chip holding tray is faced upward as a reference.

FIG. 1A is a plan view showing a condition in which one semiconductor chip 10 is held on the front surface of a first semiconductor chip holding tray according to the embodiment. FIG. 1B is a sectional view of the A-A' portion shown in FIG. 1A. FIG. 1C is a sectional view of the B-B' portion shown in FIG. 1A.

FIG. 2A is a plan view showing a condition in which one semiconductor chip 10 is held on the rear surface of a second semiconductor chip holding tray according to the embodiment. FIG. 2B is a sectional view of the a-a' portion shown in FIG. 2A, and FIG. 2C is a sectional view of the b-b' portion shown in FIG. 2A.

Figure 3A:
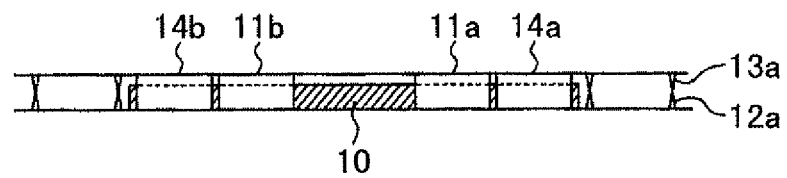
FIG. 3A is a sectional view showing a condition in which the front surface of the first semiconductor chip holding tray and the rear surface of the second semiconductor chip holding tray are opposed to each other.
Figure 3B:
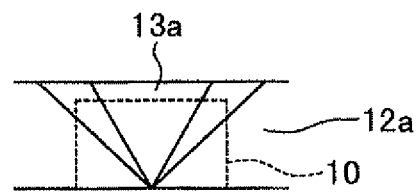
FIG. 3B is an enlarged sectional view of the place shown in FIG. 3A in which a first projection and second projection coincide.

FIG. 3A is a sectional view showing a case in which one semiconductor chip 10 is placed on the front surface of the first semiconductor chip holding tray shown in FIGS. 1A to 1C, and the semiconductor chip 10 is held with the second semiconductor chip holding tray shown in FIGS. 2A to 2C stacked thereon, and in which the front surface of the first semiconductor chip holding tray and the rear surface of the second semiconductor chip holding tray are opposed to each other. FIG. 3B is an enlarged sectional view of the place shown in FIG. 3A in which a first projection 12a and second projection 13a coincide.

The rear surface of the first semiconductor chip holding tray shown in FIGS. 1A to 1C is formed with the same structure as the rear surface of the second semiconductor chip holding tray shown in FIGS. 2A to 2C, and the front surface of the second semiconductor chip holding tray shown in FIGS. 2A to 2C is formed with the same structure as the front surface of the semiconductor chip holding tray shown in FIGS. 1A to 1C.

The semiconductor chip 10 held as shown in FIGS. 3A and 3B is, for example, a display driver of a thin display, and a bump is formed on the active surface thereof. The semiconductor chip 10 is directly mounted on a substrate by a COG method. For the purpose of preventing the bump of the active surface from being damaged, the semiconductor chip 10 is held on the semiconductor chip holding trays, as shown in FIGS. 3A and 3B, in such a way as to be conveyed in a condition in which the active surface is faced upward. Then, when taking out the semiconductor chip 10, the layered unit of semiconductor chip holding trays is turned upside down (placed in an inverse up-down relationship to the up-down relationship shown in FIGS. 3A and 3B). Next, the upper semiconductor chip holding tray is removed, and the semiconductor chip 10 with the active surface faced downward is taken out. In this way, it is possible to take the semiconductor chip out from the semiconductor chip holding tray with the active surface faced downward.

As well as a plurality of holding areas which hold the kind of semiconductor chip 10 shown in FIG. 1A being disposed on the front surface of the first semiconductor chip holding tray, a plurality of holding areas which hold the kind of semiconductor chip 10 shown in FIG. 2A are disposed on the rear surface of the second semiconductor chip holding tray. Consequently, a configuration is such that a plurality of semiconductor chips can be held in the condition shown in FIG. 3A in which the first semiconductor chip holding tray and second semiconductor chip holding tray are stacked one on the other. The plurality of holding areas are disposed, for example, in a matrix form.

A detailed description will be given of structures of raised portions and projections formed on the front surface of the first semiconductor chip holding tray shown in FIGS. 1A to 1C.

The first semiconductor chip holding tray has a base substrate (not shown), and the front surface of the base substrate has a holding area in which the semiconductor chip 10 is held, as shown in FIG. 1A. First projections 12a and 12b, each of which has a depression (refer to FIG. 1C) in which a triangular cross-section projection is fitted, are provided one at either of two short edges of the perimeter of the holding area.

Also, first raised portions 11a to 11d are provided two at either of two long edges of the perimeter of the holding area. A space L2 shown in FIG. 1A indicates the space between each of the first raised portions 11a to 11d and first projections 12a and 12b, and the semiconductor chip 10 held in the center of the holding area. Also, it is preferable that the ratio of a length a of the long edges of the semiconductor chip 10 and a length b of the short edges fulfills the following equation (1), it is preferable that the length b of the short edges is 2 mm or less, and it is preferable that the thickness of the semiconductor chip 10 is, for example, 300 μm or less.

$$0.05 \leq b/a \tag{1}$$

The cross-section shown in FIG. 1B of each of the first raised portions 11a to 11d is of a rectangular shape. The cross-section shown in FIG. 1B of each of the first projections 12a and 12b is of a trapezoidal shape, and the cross-section shown in FIG. 1C of each of the first projections 12a and 12b is of a shape having the depression in which the triangular projection is fitted.

A detailed description will be given of structures of raised portions and projections formed on the rear surface of the second semiconductor chip holding tray shown in FIGS. 2A to 2C.

The second semiconductor chip holding tray has a base substrate (not shown), and the rear surface of the base substrate has a holding area in which the semiconductor chip 10 is held, as shown in FIG. 2A. Second projections 13a and 13b of a triangular cross-section (refer to FIG. 2C) are provided one at either of two short edges of the perimeter of the holding area.

Also, second raised portions 14a to 14d are provided two at either of two long edges of the perimeter of the holding area. A space L3 shown in FIG. 2A indicates the space between each of the second raised portions 14a to 14d and second projections 13a and 13b, and the semiconductor chip 10 held in the center of the holding area.

The cross-section shown in FIG. 2B of each of the second raised portions 14a to 14d is of a rectangular shape. The cross-section shown in FIG. 2B of each of the second projections 13a and 13b is of a trapezoidal shape, and the cross-section shown in FIG. 2C of each of the second raised portions 13a and 13b is of a triangular shape.

As shown in FIGS. 3A and 3B, in a condition in which the second semiconductor chip holding tray is stacked on the first semiconductor chip holding tray in such a way that the front surface of the base substrate of the first semiconductor chip holding tray is opposed to the rear surface of the base substrate of the second semiconductor chip holding tray, the holding area formed on the front surface of the base substrate of the first semiconductor chip holding tray and the holding area formed on the rear surface of the base substrate of the second semiconductor chip holding tray are aligned, and the semiconductor chip 10 is held in the aligned holding areas. Then, the triangular cross-section second projection 13a is fitted in the triangular cross-section depression of the first projection 12a, the triangular cross-section second projection 13b is fitted in the triangular cross-section depression of the first projection 12b, and the first raised portions 11a to 11d and second raised portions 14a to 14d are neither aligned nor in contact with each other.

Also, the space L3 shown in FIG. 2A is formed larger than the space L2 shown in FIG. 1A. By so doing, when the semiconductor chip 10 is held in the holding area on the front surface of the first semiconductor chip holding tray, and the second semiconductor chip holding tray is stacked on the first semiconductor chip holding tray, it is possible to prevent the second projections 13a and 13b and second raised portions 14a to 14d on the rear surface of the second semiconductor chip holding tray from damaging the active surface of the semiconductor chip 10. Furthermore, when the layered unit of semiconductor chip holding trays is turned upside down in order to take the semiconductor chip 10 out from the semiconductor chip holding tray, it is possible to facilitate the semiconductor chip 10 being held in the holding area.

According to the heretofore described embodiment, by placing the second semiconductor chip holding tray on the first semiconductor chip holding tray, and fitting the second projections 13a and 13b in the depressions of the first projections 12a and 12b, it is possible to stably stack the first semiconductor chip holding tray and second semiconductor chip holding tray. As a result, when inverting the semiconductor chip holding trays from a faceup holding condition to a facedown holding condition, and when conveying the semiconductor chip holding trays, it does not happen that the semiconductor chip 10 overlies the first and second projections due to the semiconductor chip being made thinner and formed in a narrower strip, and it is possible to prevent a holding condition from becoming unstable.

In the embodiment, as shown in FIG. 3B, by forming the vertex angle of the triangular cross-section of the second projection 13a so as to be more acute than the vertex angle of the triangular cross-section of the depression formed in the first projection 12a, it is possible to obtain a benefit of preventing the second projection 13a from biting into the depression of the first projection 12a after the triangular second projection 13a is fitted in the depression of the first projection 12a. However, when it is possible to sufficiently suppress variations in mold processing accuracy and material molding quality of the semiconductor chip holding trays, or the like, the side surfaces of the second projection 13c may also be brought into abutment with the inner side surfaces of the depression of the first projection 12a by forming the vertex angle of the triangular cross-section of the second projection 13c so as to be the same as the vertex angle of the triangular cross-section of the depression formed in the first projection 12a, as shown in FIG. 4A.

Figure 4A:
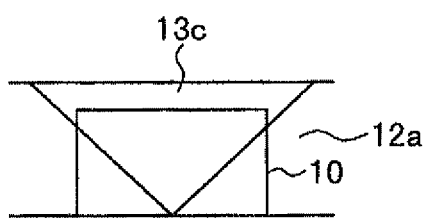
FIGS. 4A to 4C are sectional views showing modification examples of the first and second projections of the semiconductor chip holding tray according to the first embodiment.
Figure 4B:
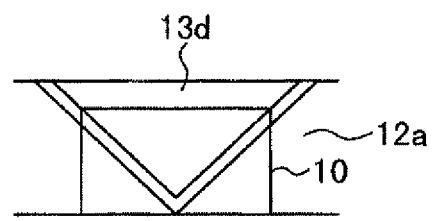
Figure 4C:
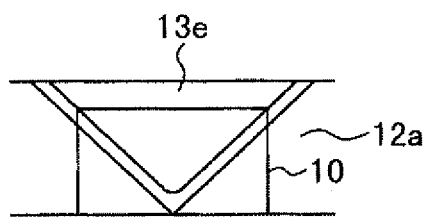

Also, in the modification example shown in FIG. 4A, a configuration is adopted wherein the side surfaces of the second projection 13c are brought into abutment with the inner side surfaces of the depression of the first projection 12a, but a configuration may also be adopted wherein the side surfaces of a second projection 13d are not brought into abutment with the inner side surfaces of the depression of the first projection 12a, as shown in FIG. 4B. Also, a configuration may also be adopted wherein the vertex of the triangular cross-section of the second projection 13d is not brought into abutment with the vertex of the triangular cross-section of the depression formed in the first projection 12a as shown in FIG. 4B. By so doing, it is possible to suppress concern over a foreign substance even in the event that the vertex of the triangle of the second projection 13d and the vertex of the triangle of the first projection 12a rub against each other. Also, the vertex of the triangular cross-section of a second projection 13e may also be formed in a rounded shape, as shown in FIG. 4C. By so doing, the fluidity of a resin when molding the semiconductor chip holding trays (for example, in the case of performing an injection molding) is stabilized, and the resin runs around to the vertex too, preventing a short mold (a defect of the leading end shape of a projecting portion) and an occurrence of a chip or burr, so it is possible to improve shape quality.

Also, in the embodiment, the first projections 12a and 12b are provided on the front surface of the base substrate, and the second projections 13a and 13b are provided on the rear surface of the base substrate, but it is also acceptable that the second projections 13a and 13b are provided on the front surface of the base substrate, and the first projections 12a and 12b are provided on the rear surface of the base substrate.

Second Embodiment

FIG. 5A is a plan view showing a condition in which one semiconductor chip 10 is held on the front surface of a first semiconductor chip holding tray according to a second embodiment, and FIG. 5B is a sectional view of the A-A' portion shown in FIG. 5A.

FIG. 6A is a plan view showing a condition in which one semiconductor chip 10 is held on the rear surface of a second semiconductor chip holding tray according to the embodiment, and FIG. 6B is a sectional view of the a-a' portion shown in FIG. 6A.

FIG. 7 is a sectional view showing a condition in which one semiconductor chip 10 is placed on the front surface of the first semiconductor chip holding tray shown in FIGS. 5A and 5B, and the semiconductor chip 10 is held with the second semiconductor chip holding tray shown in FIGS. 6A and 6B stacked thereon, and in which the front surface of the first semiconductor chip holding tray and the rear surface of the second semiconductor chip holding tray are opposed to each other.

In FIGS. 5A to 7, portions identical to those of FIGS. 1A to 1C, 3A, and 3B are given identical reference numerals and characters, and only differing portions will be described.

As shown in FIGS. 5A and 5B, depressed portions 16a to 16d are provided two at either of two long edges of the perimeter of a holding area on the front surface of a base substrate of the first semiconductor chip holding tray.

As shown in FIGS. 6A and 6B, third raised portions 17a to 17d are provided two at either of two long edges of the perimeter of a holding area on the rear surface of a base substrate of the second semiconductor chip holding tray. The third raised portions 17a to 17d are formed so that the height thereof is greater than the height of the second raised portions 14a to 14d shown in FIGS. 2A to 2C. Also, the side wall of each of the third raised portions 17a to 17d is formed in a tapered form.

As shown in FIG. 7, in a condition in which the second semiconductor chip holding tray is stacked on the first semiconductor chip holding tray, the third raised portions 17a to 17d are fitted in the depressed portions 16a to 16d. By so doing, it is possible to prevent the third raised portions 17a to 17d from pressing against the front surface of the semiconductor chip 10.

Figure 8A:
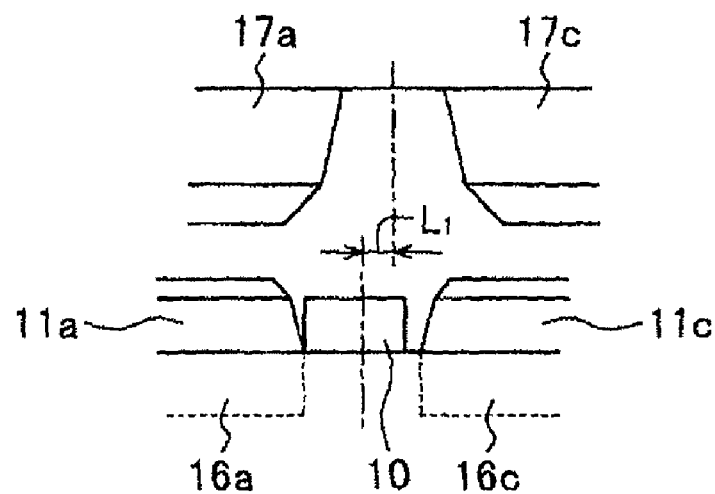
FIGS. 8A to 8C are sectional views showing in detail how the second semiconductor chip holding tray is stacked on the first semiconductor chip holding tray.
Figure 8B:
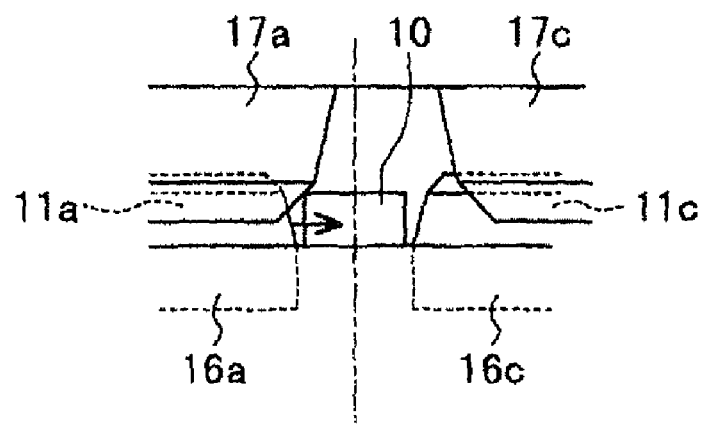
Figure 8C:
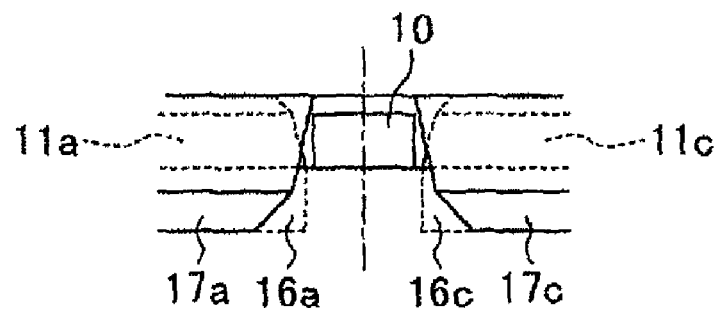

FIGS. 8A to 8C are sectional views showing in detail how the second semiconductor chip holding tray is stacked on the first semiconductor chip holding tray.

As shown in FIG. 8A, the side wall of each of the first raised portions 11a to 11d and third raised portions 17a to 17d has a two-step tapered form, and the upper portion thereof is formed in a more gently angled tapered form than the lower portion. In the embodiment, the upper portion of the side wall of each of the first raised portions 11a to 11d and third raised portions 17a to 17d is formed in the tapered form, but may also be formed in a rounded shape.

By luring the semiconductor chip 10 into the center of the holding area as arrowed by means of the gently angled taper of the upper portion of each of the third raised portions 17a to 17d, as shown in FIG. 8B, it is possible to hold the semiconductor chip 10 in the stable position shown in FIG. 8C.

In the heretofore described second embodiment too, it is possible to obtain the same advantages as those of the first embodiment.

In the embodiment, in the same way as in the first embodiment, the triangular cross-section second projections 13a and 13b are provided one at either of two short edges of the perimeter of the holding area on the rear surface of the base substrate of the second semiconductor chip holding tray, but the second projections may also be formed so that the height thereof is greater than the height of the first raised portions 11a to 11d.

Third Embodiment

In a third embodiment, a description will be given of only portions differing from those of the first embodiment.

FIG. 9A is a plan view showing the whole of the front surface of a first semiconductor chip holding tray according to the embodiment, and FIG. 9B is a plan view showing the whole of the rear surface of a second semiconductor chip holding tray according to the embodiment.

A first ring-like raised portion 36 following the outer perimeter of the base substrate 30 is provided on the front surface of a base substrate 30 of the first semiconductor chip holding tray shown in FIG. 9A. The first ring-like raised portion 36 has four projecting bosses 32 in a case in which the space L3 shown in FIG. 2A is large, for example, 200 μm or more. Projection leading ends 32a of the projecting bosses 32 are directed toward the center side of the base substrate 30, as shown in FIG. 9A.

A second ring-like raised portion 35 following the outer perimeter of a base substrate 31 is provided on the rear surface of the base substrate 31 of the second semiconductor chip holding tray shown in FIG. 9B. The second ring-like raised portion 35 has four depressed bosses 33 in the case in which the space L3 shown in FIG. 2A is large, for example, 200 μm or more. Depression base ends 33a of the depressed bosses 33 are directed toward the center side of the base substrate 31, as shown in FIG. 9B.

Figure 11A:
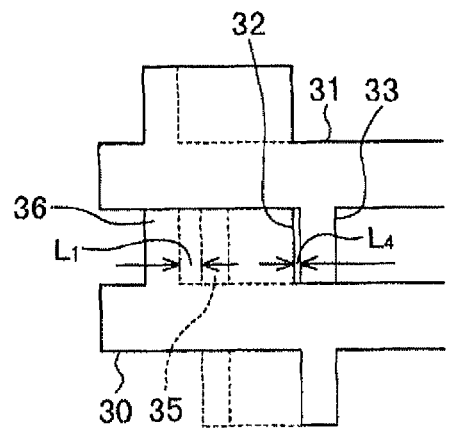
FIGS. 11A and 11B are enlarged plan views of a projecting boss and depressed boss in a left-right direction being mutually fitted.

FIG. 10A is an enlarged plan view of the projecting boss and depressed boss in a left-right direction being mutually fitted in a condition in which the second semiconductor chip holding tray shown in FIG. 9B is stacked on the first semiconductor chip holding tray shown in FIG. 9A, and FIG. 10B is an enlarged plan view of the projecting boss and depressed boss in an up-down direction being mutually fitted in the condition in which the second semiconductor chip holding tray shown in FIG. 9B is stacked on the first semiconductor chip holding tray shown in FIG. 9A. FIG. 11A is an enlarged plan view of the projecting boss and depressed boss in the left-right direction being mutually fitted.

As shown in FIGS. 10A, 10B, and 11A, the first ring-like raised portion 35 and second ring-like raised portion 36 have a space L1 therebetween, but only the space between the projection leading end 32a of the projecting boss 32 and the depression base end 33a of the depressed boss 33 is taken to be L4. The space L4 is formed smaller than the space L1. It is preferable that the space L1, the space L4, and the space L2 shown in FIG. 1A fulfill the following equation (2) or (3) and the following equation (4). Because of this, it is possible to improve the accuracy of position of the semiconductor chip in the holding area, and it is possible to improve mounting quality.

$$L4 = L2 \leq L3 \tag{2}$$

$$L4 = L2 = L3 \tag{3}$$

$$L1 \leq L3 - L2 \tag{4}$$

By forming the space L4 to be smaller than the space L1, as heretofore described, it is possible to suppress a tray's backlash, rotation, or tilting when stacking the first semiconductor chip holding tray and second semiconductor chip holding tray, it is possible to prevent the accuracy of position of the semiconductor chip from deteriorating after a tray inversion, and it is possible to prevent interference with the COG mounting.

Also, in the heretofore described embodiment too, it is possible to obtain the same advantages as those of the first embodiment.

Figure 11B:
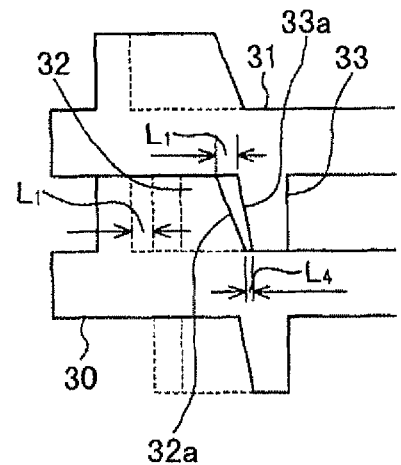

In the embodiment, as shown in FIG. 11A, the projection leading end 32a of the projecting boss 32 of the first ring-like raised portion 36 and the depression base end 33a of the depressed boss 33 of the second ring-like raised portion 35 are formed perpendicular to the base substrates 30 and 31 respectively, but it is also acceptable, as shown in FIG. 11B, that the projection leading end 32a of the projecting boss 32 of the first ring-like raised portion 36 is formed in a tapered form, and the depression base end 33a of the depressed boss 33 of the second ring-like raised portion 35 is formed in a tapered form, that the base substrate 30 side space between the projection leading end 32a and depression base end 33a is taken to be L4, and the base substrate 31 side space between the projection leading end 32a and depression base end 33a is taken to be L1, and that the taper angle of the depression base end 33a is made steeper than the taper of the projection leading end 32a. By so doing, it is possible to prevent a biting of the depression base end 33a and projection leading end 32a after the second semiconductor chip holding tray is stacked on the first semiconductor chip holding tray. Also, in this case, the space L4 may also be made zero.

Also, in the embodiment, the four projecting bosses 32 and four depressed bosses 33 are formed, but the number formed may also be other than four when necessary.

Also, in the embodiment, the space L4 is formed smaller than the space L1, but the space L1 may also be formed smaller than the space L4.

Fourth Embodiment

In a fourth embodiment, a description will be given of only portions differing from those of the third embodiment.

Figure 12A:
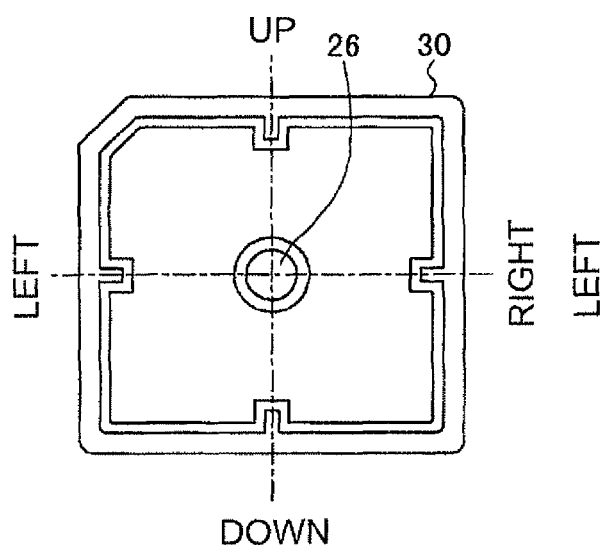
FIG. 12A is a plan view showing the whole of the front surface of a first semiconductor chip holding tray according to a fourth embodiment.
Figure 12B:
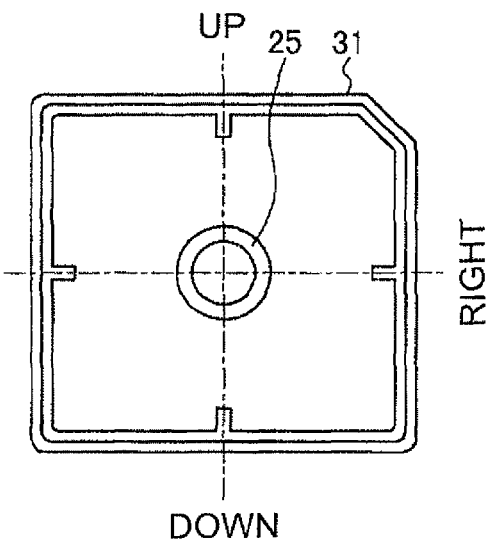
FIG. 12B is a plan view showing the whole of the rear surface of a second semiconductor chip holding tray according to the embodiment.

FIG. 12A is a plan view showing the whole of the front surface of a first semiconductor chip holding tray according to the embodiment, and FIG. 12B is a plan view showing the whole of the rear surface of a second semiconductor chip holding tray according to the embodiment.

A third ring-like raised portion 26 of a circular shape is provided in the center of the front surface of a base substrate 30 of the first semiconductor chip holding tray shown in FIG. 12A. A fourth ring-like raised portion 25 of a circular shape is provided on the rear surface of a base substrate 31 of the second semiconductor chip holding tray shown in FIG. 12B.

Figure 13:
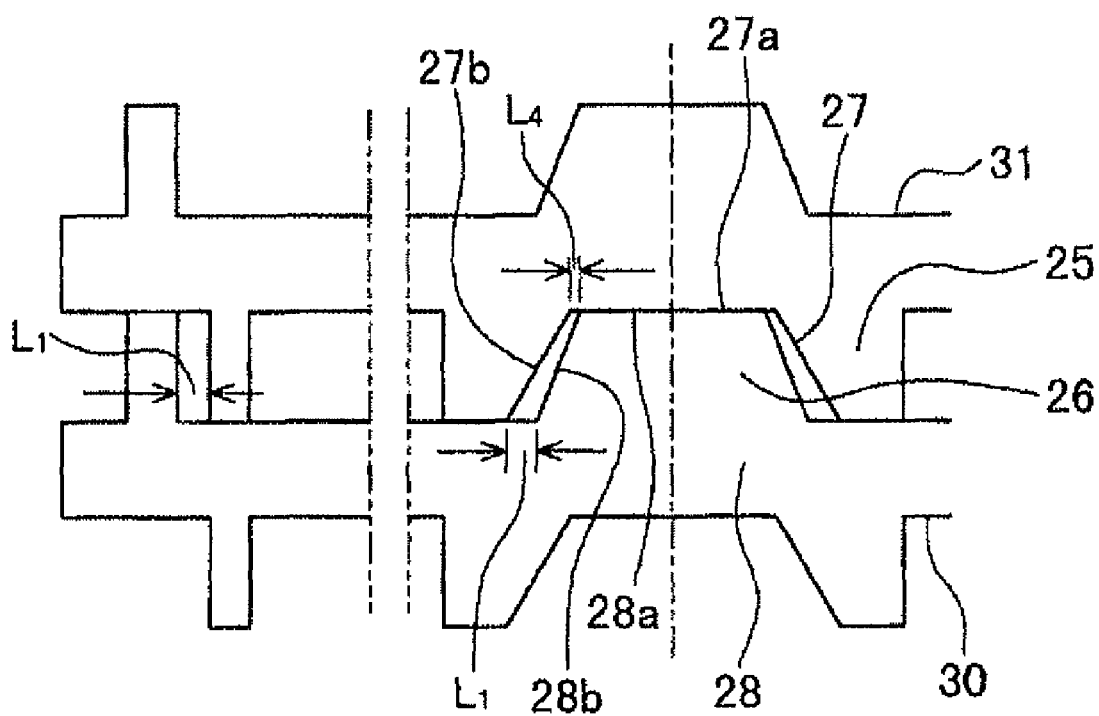
FIG. 13 is an enlarged plan view in a condition in which the second semiconductor chip holding tray shown in FIG. 12B is stacked on the first semiconductor chip holding tray shown in FIG. 12A.

FIG. 13 is an enlarged plan view of the third ring-like raised portion 26 and fourth ring-like raised portion 25 being mutually fitted in a condition in which the second semiconductor chip holding tray shown in FIG. 12B is stacked on the first semiconductor chip holding tray shown in FIG. 12A.

The third ring-like raised portion 26 has a projecting boss 28 in the case in which the space L3 shown in FIG. 2A is large, for example, 200 μm or more. A projection leading end 28a of the projecting boss 28 is directed upward perpendicular to the front surface of the base substrate 30.

The fourth ring-like raised portion 25 has a depressed boss 27 in the case in which the space L3 shown in FIG. 2A is large, for example, 200 μm or more. A depression base end 27a of the depressed boss 27 is directed downward perpendicular to the rear surface of the base substrate 31.

A side wall 28b of the projecting boss 28 of the third ring-like raised portion 26 is formed in a tapered form, a side wall 27b of the depressed boss 27 of the fourth ring-like raised portion 25 is formed in a tapered form, the base substrate 31 side space between the side wall 28b and side wall 27b is taken to be L4, the base substrate 30 side space between the side wall 28b and side wall 27b is taken to be L1, and the taper angle of the side wall 28b is made steeper than the taper of the side wall 27b. By so doing, it is possible to prevent a biting of the side wall 28b and side wall 27b after the second semiconductor chip holding tray is stacked on the first semiconductor chip holding tray. The space L4 shown in FIG. 13 may also be zero.

Also, in the heretofore described embodiment too, it is possible to obtain the same advantages as those of the third embodiment.

In the embodiment, the shape of the third and fourth ring-like raised portions 26 and 25 is a circle, but they may also be of another shape, for example, a triangle or a polygon, may also be formed of a plurality of shapes by combining other shapes, or may also be a combination of, for example, a triangle and a circle, a polygon and a circle, or a triangle and a polygon.

Fifth Embodiment

In a fifth embodiment, a description will be given of only portions differing from those of the first embodiment.

Figure 14A:
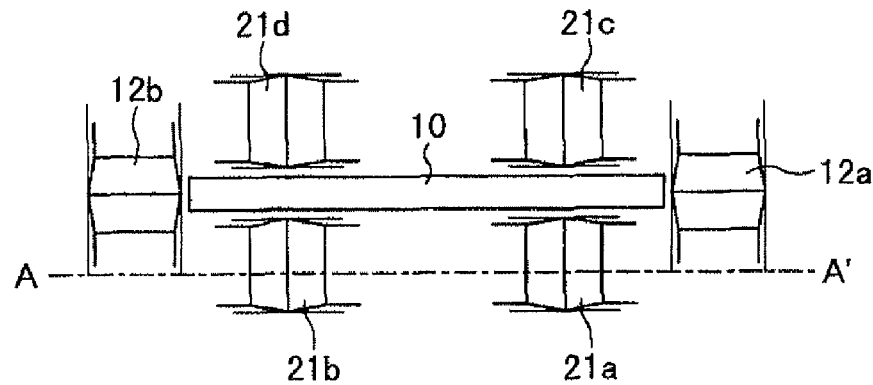
FIG. 14A is a plan view showing a condition in which one semiconductor chip is held on the front surface of a first semiconductor chip holding tray according to a fifth embodiment.
Figure 14B:
FIG. 14B is a sectional view of the A-A' portion shown in FIG. 14A.

FIG. 14A is a plan view showing a condition in which one semiconductor chip 10 is held on the front surface of a first semiconductor chip holding tray according to the embodiment. FIG. 14B is a sectional view of the A-A' portion shown in FIG. 14A.

Figure 14C:
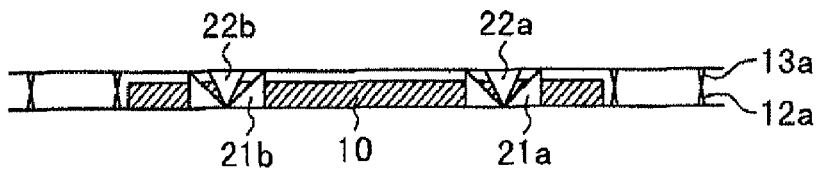
FIG. 14C is a sectional view showing a condition in which the front surface of the first semiconductor chip holding tray and the rear surface of a second semiconductor chip holding tray are opposed to each other.
Figure 14D:
FIG. 14D is a sectional view of the a-a' portion shown in FIG. 14E.
Figure 14E:
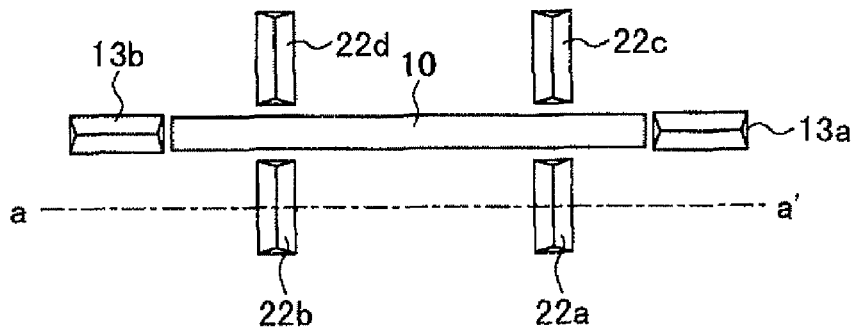
FIG. 14E is a plan view showing a condition in which one semiconductor chip is held on the rear surface of the second semiconductor chip holding tray.

FIG. 14E is a plan view showing a condition in which one semiconductor chip 10 is held on the rear surface of a second semiconductor chip holding tray according to the embodiment. FIG. 14D is a sectional view of the a-a' portion shown in FIG. 14E.

FIG. 14C is a sectional view showing a condition in which one semiconductor chip 10 is placed on the front surface of the first semiconductor chip holding tray shown in FIGS. 14A and 14B, and the semiconductor chip 10 is held with the second semiconductor chip holding tray shown in FIGS. 14D and 14E stacked thereon, and in which the front surface of the first semiconductor chip holding tray and the rear surface of the second semiconductor chip holding tray are opposed to each other.

As shown in FIGS. 14A and 14B, in the same way as the first projections 12a and 12b shown in FIGS. 1A to 1C, third projections 21a to 21d, each of which has a depression (refer to FIG. 14B) in which a triangular cross-section projection is fitted, are provided two at either of two long edges of the perimeter of a holding area on the front surface of a base substrate of the first semiconductor chip holding tray. The third projections 21a to 21d are provided in positions symmetrical around the center of the holding area.

As shown in FIGS. 14E and 14D, in the same way as the second projections 13a and 13b shown in FIGS. 2A to 2C, fourth projections 22a to 22d of a triangular cross-section (refer to FIG. 14D) are provided two at either of two long edges of the perimeter of a holding area on the rear surface of the second semiconductor chip holding tray. The fourth projections 22a to 22d are provided in positions symmetrical around the center of the holding area.

As shown in FIG. 14C, in the condition in which the second semiconductor chip holding tray is stacked on the first semiconductor chip holding tray in such a way that the front surface of the base substrate of the first semiconductor chip holding tray is opposed to the rear surface of the base substrate of the second semiconductor chip holding tray, the triangular cross-section fourth projections 22a to 22d are fitted in the triangular cross-section depressions of the corresponding third projections 21a to 21d.

In the embodiment too, it is possible to obtain the same advantages as those of the first embodiment.

Modification Example of Fifth Embodiment

In a modification example of the embodiment, a description will be given of only portions differing from those of the fifth embodiment.

Figure 15A:
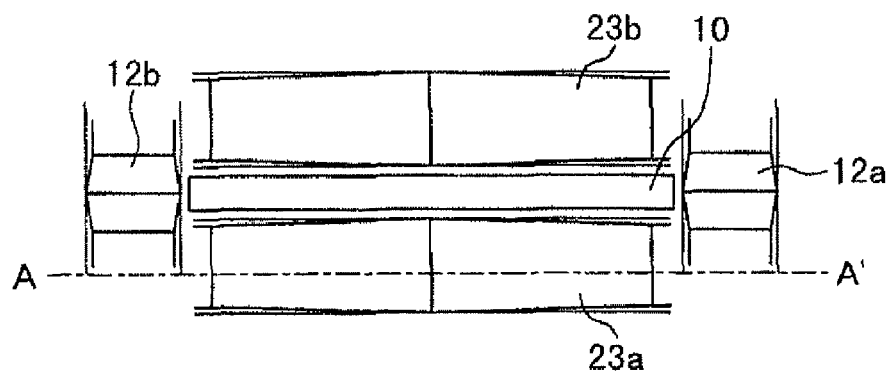
FIG. 15A is a plan view showing a condition in which one semiconductor chip is held on the front surface of a first semiconductor chip holding tray according to a modification example of the fifth embodiment.
Figure 15B:
FIG. 15B is a sectional view of the A-A' portion shown in FIG. 15A.

FIG. 15A is a plan view showing a condition in which one semiconductor chip 10 is held on the front surface of a first semiconductor chip holding tray according to the modification example. FIG. 15B is a sectional view of the A-A' portion shown in FIG. 15A.

Figure 15C:
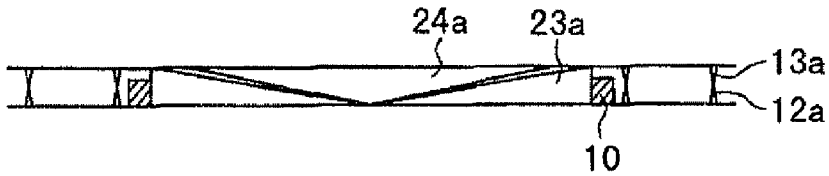
FIG. 15C is a sectional view showing a condition in which the front surface of the first semiconductor chip holding tray and the rear surface of a second semiconductor chip holding tray are opposed to each other.
Figure 15D:
FIG. 15D is a sectional view of the a-a' portion shown in FIG. 15E.
Figure 15E:
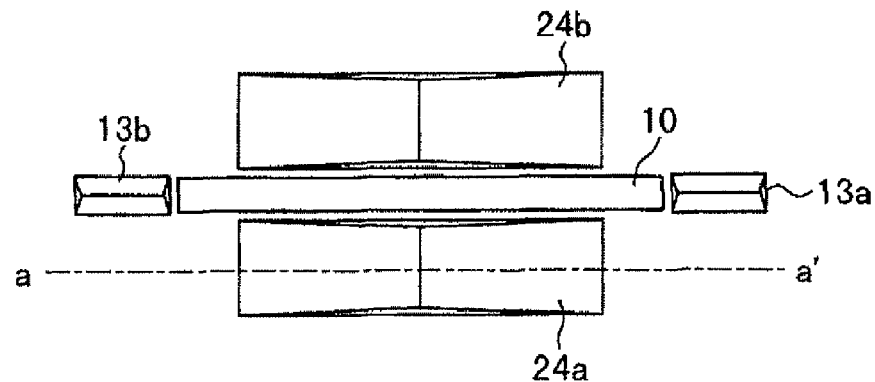
FIG. 15E is a plan view showing a condition in which one semiconductor chip is held on the rear surface of the second semiconductor chip holding tray.

FIG. 15E is a plan view showing a condition in which one semiconductor chip 10 is held on the rear surface of a second semiconductor chip holding tray according to the modification example. FIG. 15D is a sectional view of the a-a' portion shown in FIG. 15E.

FIG. 15C is a sectional view showing a condition in which one semiconductor chip 10 is placed on the front surface of the first semiconductor chip holding tray shown in FIGS. 15A and 15B, and the semiconductor chip 10 is held with the second semiconductor chip holding tray shown in FIGS. 15D and 15E stacked thereon, and in which the front surface of the first semiconductor chip holding tray and the rear surface of the second semiconductor chip holding tray are opposed to each other.

As shown in FIGS. 15A and 15B, fifth projections 23a and 23b, each of which has a depression (refer to FIG. 15B) in which a triangular cross-section projection is fitted, are provided one at either of two long edges of the perimeter of a holding area on a base substrate of the first semiconductor chip holding tray. The fifth projections 23a and 23b are formed longer (horizontally longer) in a direction parallel to the heretofore described long edges than the third projections 21a to 21d shown in FIGS. 14A and 14B.

As shown in FIGS. 15E and 15D, sixth projections 24a and 24b of a triangular cross-section (refer to FIG. 15D) are provided one at either of two long edges of the perimeter of a holding area on the rear surface of a base substrate of the second semiconductor chip holding tray. The sixth projections 24a and 24b are formed longer (horizontally longer) in a direction parallel to the heretofore described long edges than the fifth projections 22a to 22d shown in FIGS. 14E and 14D.

In the modification example too, it is possible to obtain the same advantages as those of the fifth embodiment.

Sixth Embodiment

In a sixth embodiment, a description will be given of only portions differing from those of the first embodiment.

Figure 16A:
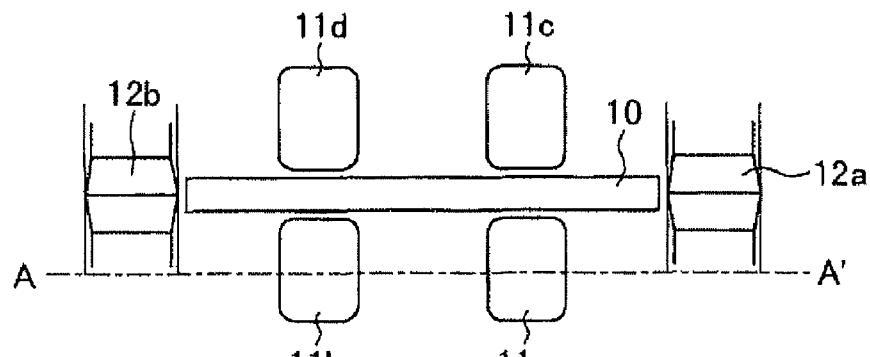
FIG. 16A is a plan view showing a condition in which one semiconductor chip is held on the front surface of a first semiconductor chip holding tray according to a sixth embodiment.
Figure 16B:
FIG. 16B is a sectional view of the A-A' portion shown in FIG. 16A.

FIG. 16A is a plan view showing a condition in which one semiconductor chip 10 is held on the front surface of a first semiconductor chip holding tray according to the embodiment. FIG. 16B is a sectional view of the A-A' portion shown in FIG. 16A.

Figure 16C:
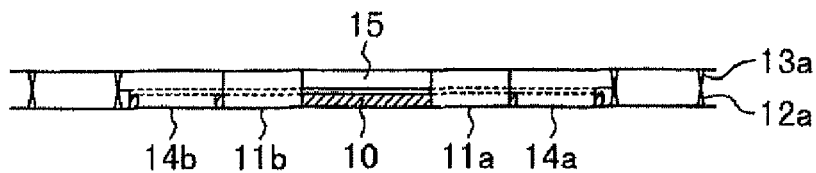
FIG. 16C is a sectional view showing a condition in which the front surface of the first semiconductor chip holding tray and the rear surface of the second semiconductor chip holding tray are opposed to each other.
Figure 16D:
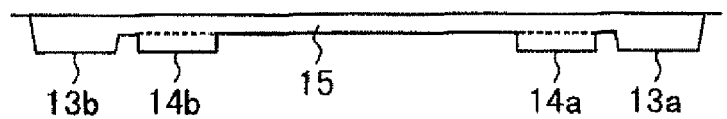
FIG. 16D is a sectional view of the a-a' portion shown in FIG. 16E.
Figure 16E:
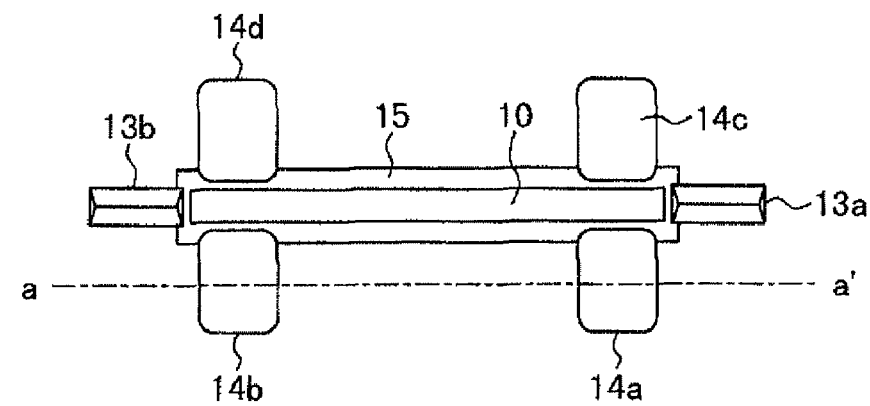
FIG. 16E is a plan view showing a condition in which one semiconductor chip is held on the rear surface of a second semiconductor chip holding tray according to the embodiment.

FIG. 16E is a plan view showing a condition in which one semiconductor chip 10 is held on the rear surface of a second semiconductor chip holding tray according to the embodiment. FIG. 16D is a sectional view of the a-a' portion shown in FIG. 16E.

FIG. 16C is a sectional view showing a condition in which one semiconductor chip 10 is placed on the front surface of the first semiconductor chip holding tray shown in FIGS. 16A and 16B, and the semiconductor chip 10 is held with the second semiconductor chip holding tray shown in FIGS. 16D and 16E stacked thereon, and in which the front surface of the first semiconductor chip holding tray and the rear surface of the second semiconductor chip holding tray are opposed to each other.

As shown in FIGS. 16D and 16E, in order to hold a semiconductor chip 10 made thinner than that of the first embodiment, a pedestal (an island) 15 is formed in a holding area. By holding the semiconductor chip 10 on the pedestal 15, it is possible to make the height of first raised portions 11a to 11d and first projections 12a and 12b greater than in the first embodiment having no pedestal. As a result, it is possible to more stably hold the semiconductor chip 10 made thinner.

Also, by combining the structures of FIGS. 5A to 7, it is possible to increase the height of the second raised portions 14a to 14d and second projections 13a and 13b. As a result, it is possible to more stably hold the semiconductor chip 10 made thinner.

With the embodiment, it is possible to appropriately combine the embodiment with the other embodiments shown in the present specification.

What is claimed is:

1. A semiconductor chip holding tray, a plurality of which are used by being stacked one on another, which holds a plurality of semiconductor chips of a rectangular planar shape, comprising:
    a base substrate;
    a first projection which, being provided on the front surface of the base substrate, and disposed on a short edge side of the perimeter of a holding area in which one semiconductor chip is held, has a depression having a triangular cross-section in which a triangular cross-section projection is fitted;
    a first raised portion which, being provided on the front surface of the base substrate, is disposed on a long edge side of the perimeter of the holding area;
    a triangular cross-section second projection which, being provided on the rear surface of the base substrate, is disposed on a short edge side of the perimeter of a holding area in which one semiconductor chip is held, a vertex angle of the triangular cross-section second projection being more acute than a vertex angle of the depression of the first projection; and
    a second raised portion which, being provided on the rear surface of the base substrate, is disposed on a long edge side of the perimeter of the holding area, wherein
    when two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, the second projection is fitted in the depression of the first projection, and the first raised portion and second raised portion are not aligned.

2. A semiconductor chip holding tray, a plurality of which are used by being stacked one on another, which holds a plurality of semiconductor chips of a rectangular planar shape, comprising:
    a base substrate;
    a first projection which, being provided on the front surface of the base substrate, and disposed on a short edge side of the perimeter of a holding area in which one semiconductor chip is held, has a depression having a triangular cross-section in which a triangular cross-section projection is fitted;
    a depressed portion which, being provided on the front surface of the base substrate, is disposed on a long edge side of the perimeter of the holding area;

a triangular cross-section second projection which, being provided on the rear surface of the base substrate, is disposed on a short edge side of the perimeter of a holding area in which one semiconductor chip is held, a vertex angle of the triangular cross-section second projection being more acute than a vertex angle of the depression of the first projection; and a raised portion which, being provided on the rear surface of the base substrate, is disposed on a long edge side of the perimeter of the holding area, wherein when two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, and the second projection is fitted in the depression of the first projection.

3. The semiconductor chip holding tray according to claim 2, wherein the side wall of the raised portion is formed in a two-step tapered form, and the upper portion of the side wall of the raised portion is formed in a more gently angled tapered form than the lower portion.

4. The semiconductor chip holding tray according to claim 1, comprising:

a first ring-like raised portion which, being formed on the front surface of the base substrate, is formed along the outer perimeter of the base substrate; and a second ring-like raised portion which, being formed on the rear surface of the base substrate, is formed along the outer perimeter of the base substrate, wherein the first ring-like raised portion has a projecting boss whose projection leading end is directed toward the center side of the front surface of the base substrate, the second ring-like raised portion has a depressed boss whose depression base end is directed toward the center side of the rear surface of the base substrate, and when two semiconductor chip holding trays are stacked one on the other in such a way that the front surface of the base substrate is opposed to the rear surface of the base substrate, the first ring-like raised portion and second ring-like raised portion have a space L1 therebetween, and the projection leading end and depression base end have therebetween a space L4 smaller than the space L1.

5. The semiconductor chip holding tray according to claim 1, comprising:

a first ring-like raised portion formed on the front surface of the base substrate; and a second ring-like raised portion formed on the rear surface of the base substrate, wherein the first ring-like raised portion has a projecting boss whose projection leading end is directed upward perpendicular to the front surface of the base substrate, the second ring-like raised portion has a depressed boss whose depression base end is directed downward perpendicular to the rear surface of the base substrate, the side wall of each of the projecting boss and depressed boss is formed in a tapered form, and when two semiconductor chip holding trays are stacked one on the other in such a way that the front surface of the base substrate is opposed to the rear surface of the base substrate, a base substrate rear surface side space L4 between the side wall of the projecting boss and the side wall of the depressed boss is formed smaller than a base substrate front surface side space L1 between the side wall of the projecting boss and the side wall of the depressed boss.

6. A semiconductor chip holding tray, a plurality of which are used by being stacked one on another, which holds a plurality of semiconductor chips of a rectangular planar shape, comprising:

a base substrate;

a first projection which, being provided on the front surface of the base substrate, and disposed on a short edge side of the perimeter of a holding area in which one semiconductor chip is held, has a depression having a triangular cross-section in which a triangular cross-section projection is fitted;

a second projection which, being provided on the front surface of the base substrate, and disposed on a long edge side of the perimeter of the holding area, has a depression in which a triangular cross-section projection is fitted;

a triangular cross-section third projection which, being provided on the rear surface of the base substrate, is disposed on a short edge side of the perimeter of a holding area in which one semiconductor chip is held, a vertex angle of the triangular cross-section third projection being more acute than a vertex angle of the depression of the first projection; and a triangular cross-section fourth projection which, being provided on the rear surface of the base substrate, is disposed on a long edge side of the perimeter of the holding area, wherein when two semiconductor chip holding trays are stacked one on the other in such a way that the front surface of the base substrate is opposed to the rear surface of the base substrate, the holding area formed on the front surface of the base substrate and the holding area formed on the rear surface of the base substrate are aligned, and the third and fourth projections are fitted in the depressions of the corresponding first and second projections.

7. The semiconductor chip holding tray according to claim 1, further comprising:

a pedestal provided in the holding area on the front surface of the base substrate.

* * * * *